United States Patent
Futatsuyama

(10) Patent No.: US 7,495,957 B2
(45) Date of Patent: Feb. 24, 2009

(54) NONVOLATILE MEMORY DEVICE HAVING A BLOCK ERASE OPERATION

(75) Inventor: Takuya Futatsuyama, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 37 days.

(21) Appl. No.: 11/612,900

(22) Filed: Dec. 19, 2006

(65) Prior Publication Data
US 2007/0147121 A1 Jun. 28, 2007

(30) Foreign Application Priority Data
Dec. 28, 2005 (JP) ............... 2005-378861

(51) Int. Cl.
*G11C 16/04* (2006.01)
(52) U.S. Cl. ............... 365/185.11; 365/185.29; 365/200; 365/230.06
(58) Field of Classification Search ............ 365/185.11, 365/185.29, 200, 230.03, 230.06
See application file for complete search history.

(56) References Cited

U.S. PATENT DOCUMENTS

| | | | |
|---|---|---|---|
| 6,735,116 B2 | 5/2004 | Lee et al. | |
| 7,188,210 B2 * | 3/2007 | Komatsu et al. | ............ 711/103 |
| 7,257,666 B2 * | 8/2007 | Komatsu et al. | ............ 711/103 |
| 2002/0012270 A1 * | 1/2002 | Taura et al. | ............ 365/185.09 |
| 2004/0240254 A1 * | 12/2004 | Shiga et al. | ................ 365/154 |
| 2005/0041515 A1 | 2/2005 | Futatsuyama et al. | |
| 2005/0141284 A1 | 6/2005 | Futatsuyama | |

FOREIGN PATENT DOCUMENTS

| | | |
|---|---|---|
| JP | 2003-203493 | 7/2003 |
| JP | 2005-25891 | 1/2005 |
| JP | 2005-135544 | 5/2005 |
| JP | 2005-191413 | 7/2005 |

* cited by examiner

*Primary Examiner*—Thong Q Le
(74) *Attorney, Agent, or Firm*—Oblon, Spivak, McClelland, Maier & Neustadt, P.C.

(57) ABSTRACT

According to a nonvolatile semiconductor memory device of the present invention, an address decode section 130 is provided in a block address decode circuit provided in a row decoder of a NAND-type flash memory device. The address decode section 130 has a selected block data storage section 132 composed of a latch circuit, a set section 134, and a reset section 136. The reset section 136 is composed of two nMOS transistors. Thus, defective block data and selected block data to be subjected to a multiple block erasure can be alternately stored in accordance with an operation without causing a complicated circuit structure or an increased chip size.

15 Claims, 13 Drawing Sheets

NONVOLATILE MEMORY DEVICE HAVING A BLOCK ERASE OPERATION

CROSS-REFERENCE TO RELATED APPLICATIONS

This application is based upon and claims the benefit of priority from the prior Japanese Patent Applications No. 2005-378861, filed on Dec. 28, 2005, the entire contents of which are incorporated herein by reference.

TECHNICAL FIELD

The present invention relates to a nonvolatile semiconductor memory device. More specifically, the present invention relates to a NAND-type flash memory device having a block erase operation.

BACKGROUND OF THE INVENTION

NAND-type flash memory devices have been used for various applications as a nonvolatile semiconductor memory device. A NAND-type flash memory device has a memory cell array for storing data. A memory cell array is composed of a plurality of memory blocks. Each memory block has memory cells arranged in a matrix comprising of a plurality of rows (word line) and a plurality of columns (bit line). Memory cells in each column constitute a NAND string in which two selection transistors have therebetween a plurality of serially-connected memory cells. Memory cells in each row constitute a page.

A NAND-type flash memory device is structured so that a program operation and a read-out operation are performed on the basis of a page unit. Thus, a NAND-type flash memory device is preferable as a memory in which a large amount of music data or video data is read and programmed simultaneously. A NAND-type flash memory device has been widely used as a USB flash memory (portable flash memory providing connection to a USB connector of a computer) for digital audio equipment or a digital still camera for example.

A NAND-type flash memory device is mainly composed of, for example, a memory cell area for storing data, a resistor for an input or output of data to or from outside, and a decoder for a row direction (word line) and a column direction (bit line), respectively. A program operation to a NAND-type flash memory device (data programming or verify-read processing) is performed on the basis of a page unit. A resistor that temporarily stores to-be-programmed data and to-be-read data is externally provided to a NAND flash memory device. In order to program data to a memory cell, the resistor firstly stores therein the data (e.g., 512 byte or 2048 byte) to subsequently program the stored data to the memory cell. The time required for programming the data to the memory cell is about 200 μsec. In order to read-out data of a page which is desired to be read-out from the memory cell, the data of the page is firstly transferred to the resistor to subsequently output the data from the resistor in a serial manner. This read-out operation requires about 25 μsec for transferring the data from the memory cell and is performed with a short cycle of about 50 nsec in which the data is serially transferred from the resistor. When data is erased, a plurality of pages are simultaneously erased by a block erase operation with about 2 msec, which is longer than the time required for the data program and read-out operations.

Music data and image data require a large file capacity. Thus, a device such a NAND-type flash memory device that can be programmed or read-out with a high speed has increasingly been required. This has provided NAND-type flash memory devices having a higher memory cell capacity and a larger writing unit (page) and a larger erasure unit (block).

Japanese Laid-open Publication No. 2003-203493 for example discloses a NAND-type flash memory device having a means for programming and reading data to or from a NAND-type flash memory device with the higher speed. According to this NAND-type flash memory device, so-called multi page program operation, multi page reading operation, and multiple block erasure operation are performed to simultaneously select a plurality of pages to be programmed or read-out and to simultaneously erase a plurality of blocks.

SUMMARY OF THE INVENTION

A nonvolatile semiconductor memory device according to one embodiment of the present invention is characterized including:

a nonvolatile memory cell that can be electrically programmed, read-out, and erased and which is divided to a plurality of blocks;

a block address decode section for selecting one of the plurality of blocks; and a selected block data storage section which is provided in the block address decode section, that stores erasure block data in an operation for simultaneously erasing the plurality of blocks in a well of the nonvolatile memory cell, and that stores defective block data in operations other than the operation for simultaneously erasing the plurality of blocks in a well of the nonvolatile memory cell.

DETAILED DESCRIPTION OF THE INVENTION

Figure 1:
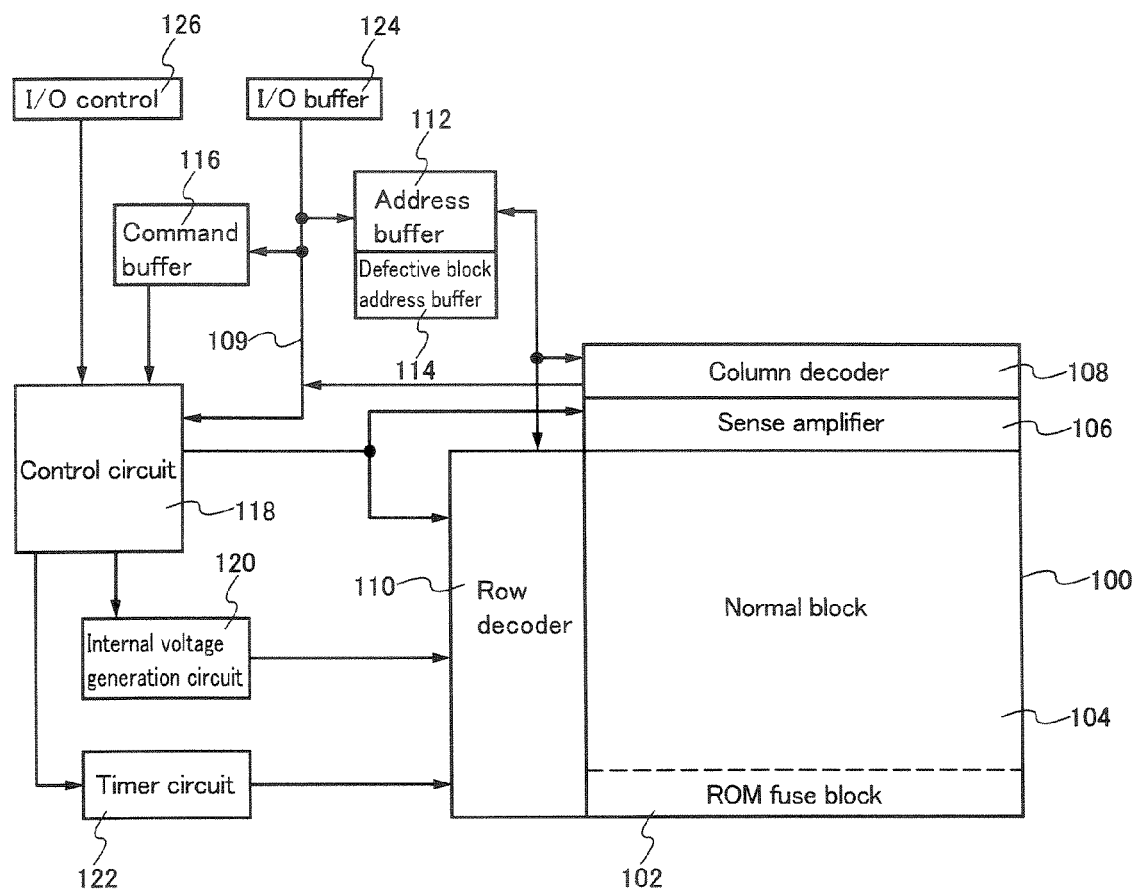
FIG. 1 is a block diagram illustrating the structure of a NAND-type flash memory device according to one embodiment of the present invention.

Embodiments of the present invention will be described in detail with reference to the drawings. FIG. 1 is a block diagram illustrating the structure of a NAND-type flash memory device according to the present invention. A memory cell array 100 is composed of nonvolatile memory cells that can be electrically overwritten and that are arranged in rows and columns in a matrix-like manner. This nonvolatile memory cell has a stacked gate-type MOS transistor structure in which a control gate and a charge accumulation layer are layered.

In FIG. 1, one of the nonvolatile memories in the memory cell array 100 is selected by a plurality of word lines WL and bit lines BL arranged so as to intersect one another. A plurality of word lines WL are selectively driven by a decode output from a row decoder 110.

The memory cell array 100 has a plurality of NAND cell units commonly connected with a word line WL. A plurality of NAND cell units collectively constitute a cell block which is used as the minimum unit for data erasure. This memory cell array 100 includes: a normal block 104 for storing data; and a ROM fuse block 102 for storing a read-out/programming/erasure voltage initial value, defective block address data, and/or defective column address data for example. Specifically, when a defective block exists in which data cannot be programmed or erased, the address data regarding the defective block is stored in the ROM fuse block 102.

The ROM fuse block 102 stores therein an initial set value of a parameter showing a chip circuit operation characteristic depending on a variation in a circuit operation or a defect caused by a defective part caused in the manufacture of the chip of a NAND-type flash memory device. The ROM fuse block 102 also may be structured so as to appropriately update a circuit operation parameter and/or defective block data changing with time during which the NAND-type flash memory device is used.

A signal read-out from a memory cell in the memory cell array 100 by a data reading operation is input via a bit line BL to a sense amplifier 106 and is sensed by the sense amplifier 106. The data sensed by the sense amplifier 106 is input, by the column decoder 108, to an I/O bus 109 selected on the basis of a column unit and is output from an I/O buffer 124. When data is programmed, to-be-programmed data input from outside is input to the I/O buffer 124 and is input to the I/O bus 109 and the column decoder 108. Based on the data input to the column decoder 108, a voltage in accordance with the to-be-programmed data is supplied via the sense amplifier 106 to the bit line BL to which the to-be-programmed data should be programmed. Consequently, the data is programmed to the selected memory cell in the memory cell array 100.

The I/O buffer 124 is input with address data for selecting a memory cell or a command for controlling an operation of a memory cell which is data input from an external device in order to control the operation of the NAND-type flash memory device. The address data input to the I/O buffer 124 is acquired by the address buffer 112 and the command input to the I/O buffer 124 is acquired by the command buffer 116. Among the address data acquired by the address buffer 112, a row address is input to the row decoder 110 and a column address is input to the column decoder 108.

A defective block address buffer 114 is provided in order to store, when the ROM fuse block 102 stores therein data for a defective block, defective block address data corresponding to the defective block. The defective block address buffer 114 provides the defective block address data to the row decoder 110. The defective block address data input to the row decoder 110 is stored in a latch provided in a block address decode circuit (not shown) in the row decoder.

An internal voltage generation circuit 120 is a circuit that generates various voltages used in a chip such as Vref (reference voltage), Vpgm (program voltage), an internal power supply voltage (Vdd), erasure voltage (Verase), and a not-selected cell word line voltage (Vread for read-out and Vpass for programming) supplied to a word line of a not-selected cell. The respective voltages generated by the internal voltage generation circuit 120 are supplied to the row decoder 110 for example.

A timer circuit 122 generates various timing pulses used in a chip.

An I/O control 126 acquires various control signals input from outside such as a chip enable signal /CE, a read enable signal /RE, or a write enable signal /WE. A control signal acquired by the I/O control 126 and a command acquired by the command buffer 116 are input to the control circuit 118.

Based on a result of decoding the control signal and the command input from the I/O control 126 and the command buffer 116, respectively, the control circuit 118 controls the operation of the row decoder 110 and the column decoder 108 for example. The control circuit 118 includes therein various resistors for storing data for control. The control circuit 118 also has a function to output a ready/busy signal (R/Bn) that shows an external circuit whether a chip can be accessed or not.

Figure 8:
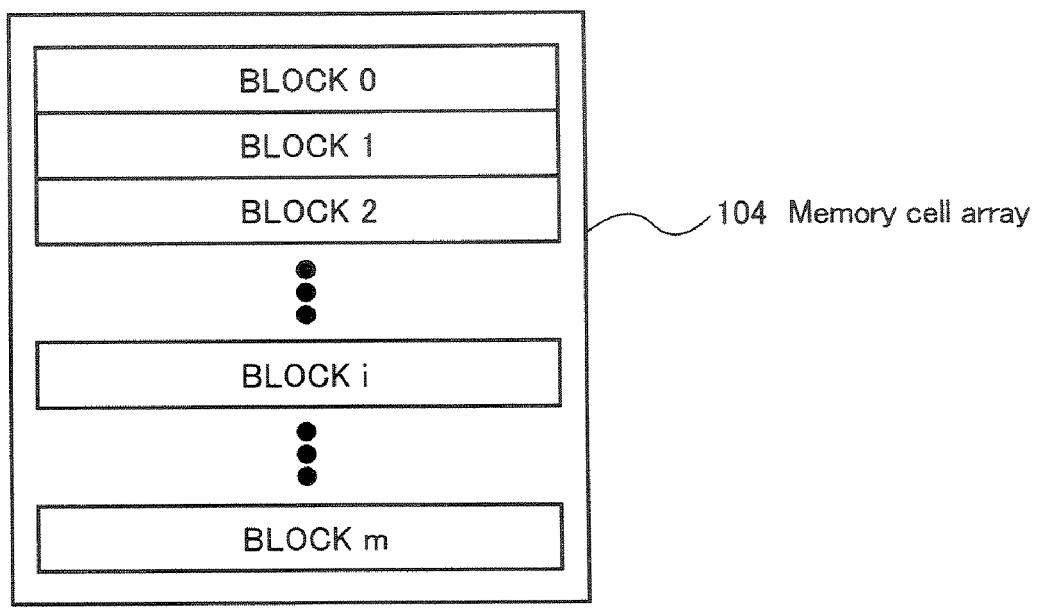
FIG. 8 shows a detailed structure of a memory cell array according to one embodiment of the present invention.

FIG. 8 shows a detailed structure of the memory cell array 104. The memory cell array 104 is divided into a plurality of blocks 105. In FIG. 8, the memory cell array 104 is divided into a total of "m" blocks (BLOCK 1, BLOCK 2, ..., BLOCK i, ..., BLOCK m). The term "block" means the minimum unit for data erasure.

Figure 9:
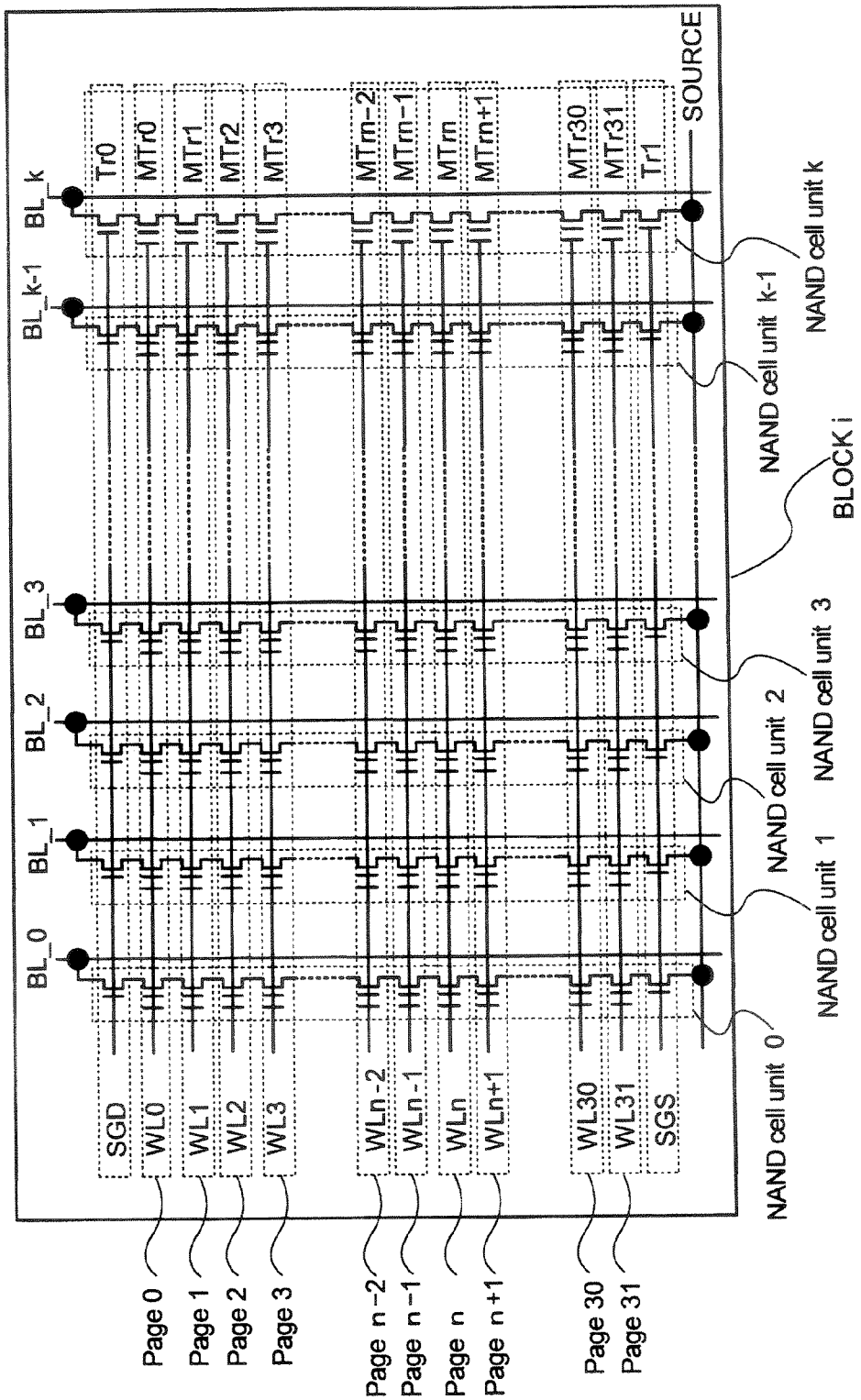
FIG. 9 shows a detailed structure of a block in the memory cell array according to one embodiment of the present invention.

The respective blocks BLOCK 1 to BLOCK m are composed of k+1 NAND cell units 0 to k, respectively, as in the block BLOC Ki typically shown in FIG. 9. Each NAND cell unit is composed of serially-connected 32 memory cells MTr0 to MTr31 for example. One end thereof is connected, via a selection gate transistor Tr0 connected to a selection gate line SGD, to a bit line BL (BL_0, BL_1, BL_2, BL_3, ..., BL_k-1, BL_k) and the other end thereof is connected, via a selection gate transistor Tr1 connected to a selection gate line SGS, to a common source line SOURCE. A control gate of each memory cell MTr is connected to a word line WL (WL0 to WL31). One word line WL is connected with "k+1" memory cells MTr that store one bit data and that constitute "page" as a unit.

The above section for FIG. 8 has described "m" blocks constituting a memory cell array and the above section for FIG. 9 has described one block including "k+1" NAND cell units comprising of 32 memory cells MTr. However, the present invention is not limited to this. Any number of blocks, memory cells MTr, and NAND cell units also can be used (e.g., 64) depending on a desired capacity.

Although the above section has described that the respective memory cells MTr store one bit data, another configuration may also be used in which the respective memory cells MTr store data of a plurality of bits (multiple-value bit data) depending on an electronic implantation amount. Although the above section has described an example of a NAND-type flash memory device in which one NAND cell unit is connected to one bit line BL, the NAND-type flash memory device of the present invention may also be applied to a so-called Shared Bit Line-type NAND-type flash memory device in which a plurality of NAND cell units share one bit line BL.

Figure 10:
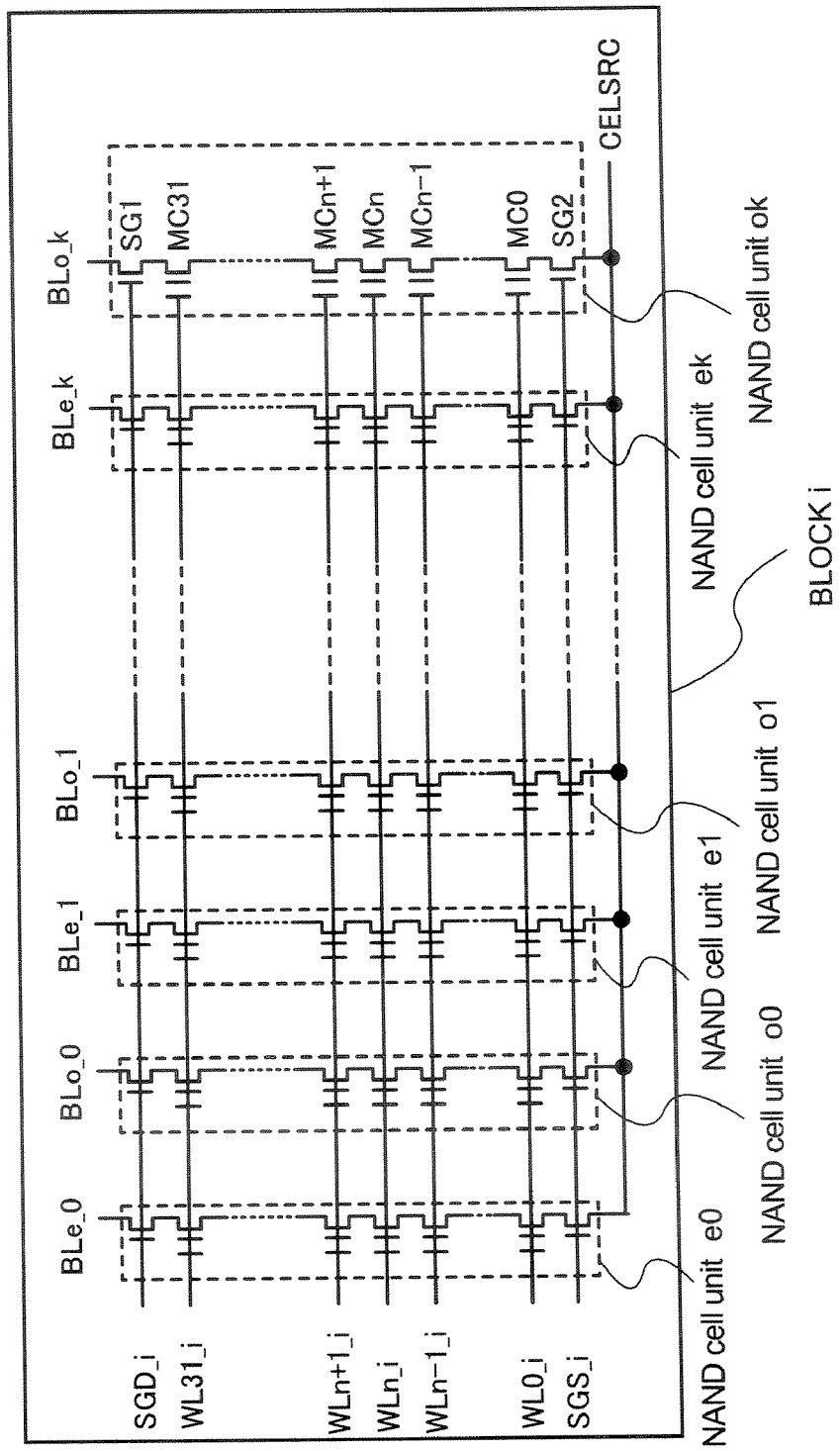
FIG. 10 shows a detailed structure of a block in the memory cell array according to one embodiment of the present invention.

As in the block BLOC Ki typically shown in FIG. 10, the respective blocks BLOCK 1 to BLOCK m are composed of $2 \times (k+1)$ NAND cell units e0 to ok, respectively. The respective NAND cell units are composed of 32 memory cells MC0 to MC31 that are serially connected. One end thereof is connected, via a selection gate transistor SG1 connected to a selection gate line SGD_i, to a bit line BL (BLe_0, BLo_0, ..., BLe_k, BLo_k) and the other end thereof is connected, via a selection gate transistor SG2 connected to an election gate line SGS_i, to a common source line CELSRC. The respective memory cells MC have control gates connected to word lines WL (WL0_i to WL31_i). Data is programmed and read-out to and from an even numbered bit line BL_e from 0 and an odd numbered bit line BL_o from 0 so that the former and the latter are independent from each other. Among $2 \times (k+1)$ memory cells connected to one word line WL, k+1 memory cells connected to the even numbered bit line BL_e are simultaneously subjected to data program and data read-out operations. The respective memory cells store 2 bit data and these k+1 memory cells constitute a unit of "page".

Similarly, k+1 memory cells that are connected to one word line WL and that are connected to the odd numbered bit line BL_o constitute another one page. Memory cells in this page are simultaneously subjected to data program and data read-out operations.

Although the above section has described an example in which $2 \times (k+1)$ NAND memory cell units are provided each of which is composed of "m" blocks and one block is composed of 32 memory cells, the present invention is not limited to this. Thus, the number of blocks, the number of memory cells, and the number of memory cell units may also be changed depending on a desired capacity.

In the memory cell array 104 shown in FIG. 8 as described above, the cell block BLOCK m is used as an initial setting data storage area for storing initial setting data. This initial setting data storage area can be subjected to data program, data erasure, and data read-out operations by selectively driving the bit line BL and the word line WL but is not accessed from outside during a normal operation of the memory. Thus, the data in this initial setting data storage area is not erased even when a data collective erasure or erasure on the basis of a block unit is performed. Specifically, data for a defective block is stored in the memory cell array 100 and the data is read-out from the initial setting data storage area when a power source is turned ON for example. Thus, the data for the defective block stored in the memory cell array 100 can be updated when another defective block is caused during chip usage. Specifically, this initial setting data storage area is an area corresponding to the ROM fuse block 102 in FIG. 1.

Figure 11:
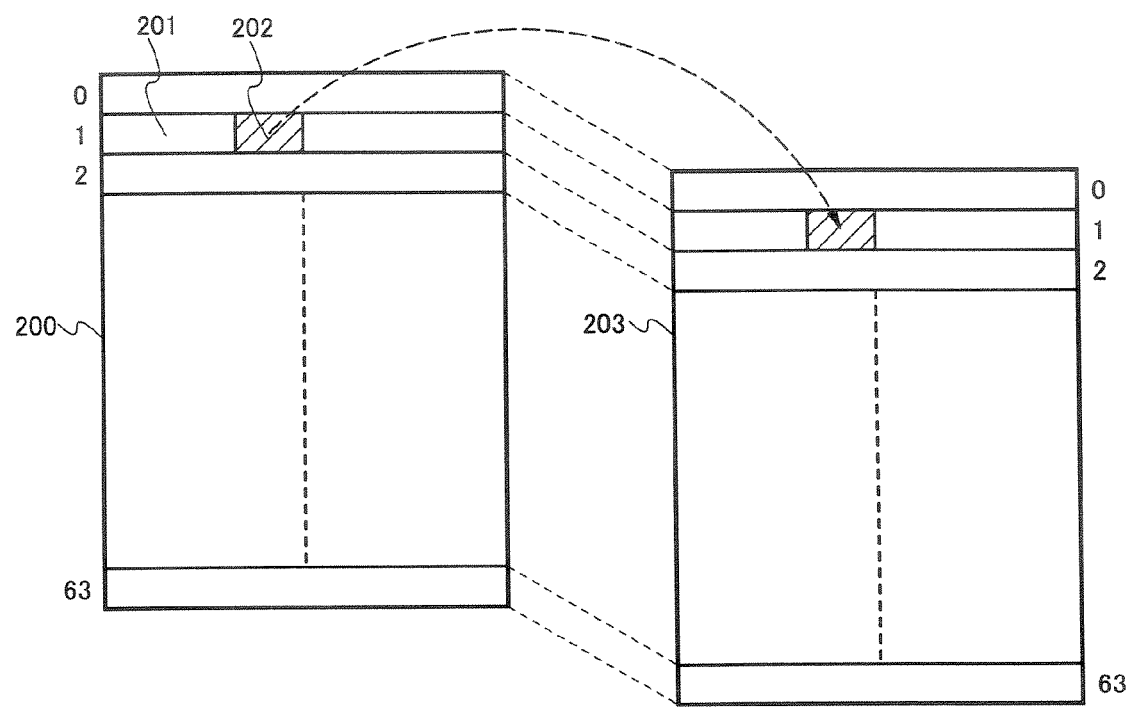
FIG. 11 illustrates an operation of a NAND-type flash memory device to rewrite a part of a file stored in one page of a block to overwrite and save the data.

A NAND-type flash memory device has a characteristic according to which, in contrast with a magnetic disk (hard disk) for example, the same memory area in a NAND-type flash memory device cannot be directly subjected to an overwrite save operation. This characteristic will be described with reference to FIG. 11. In order to rewrite a part of the file data 202 stored in the first page 201 of the block 200 comprising of 0 to 63 pages to overwrite-save this part, the page 201 storing the file 202 is read-out to update the file 202. Thereafter, a new page of another block 203 is programmed. The remaining 63 pages are also programmed even when these pages are blank pages. Thereafter, the original data stored in the block 200 is no longer required and thus is subjected to a block erasure operation. In the rewrite operation, completion of the programming of the changed data is followed by the move of the data for the block (program or reading operation) to subsequently perform the erasure operation. Thus, a frequent rewrite operation may cause accumulated original blocks left unerased.

To prevent this, a multiple block erasure for collectively erasing a plurality of blocks may be effective to perform the block erasure more effectively. In order to perform a multiple block erasure, a function for selecting a plurality of blocks to be subjected to an erasure operation must be added to a driving circuit of the NAND-type flash memory device.

A NAND-type flash memory device also has a function to prevent access to a defective block. For example, one NAND-type flash memory device is provided in which a row selection section (row decoder) includes a latch for storing data for a defective block.

Figure 12:
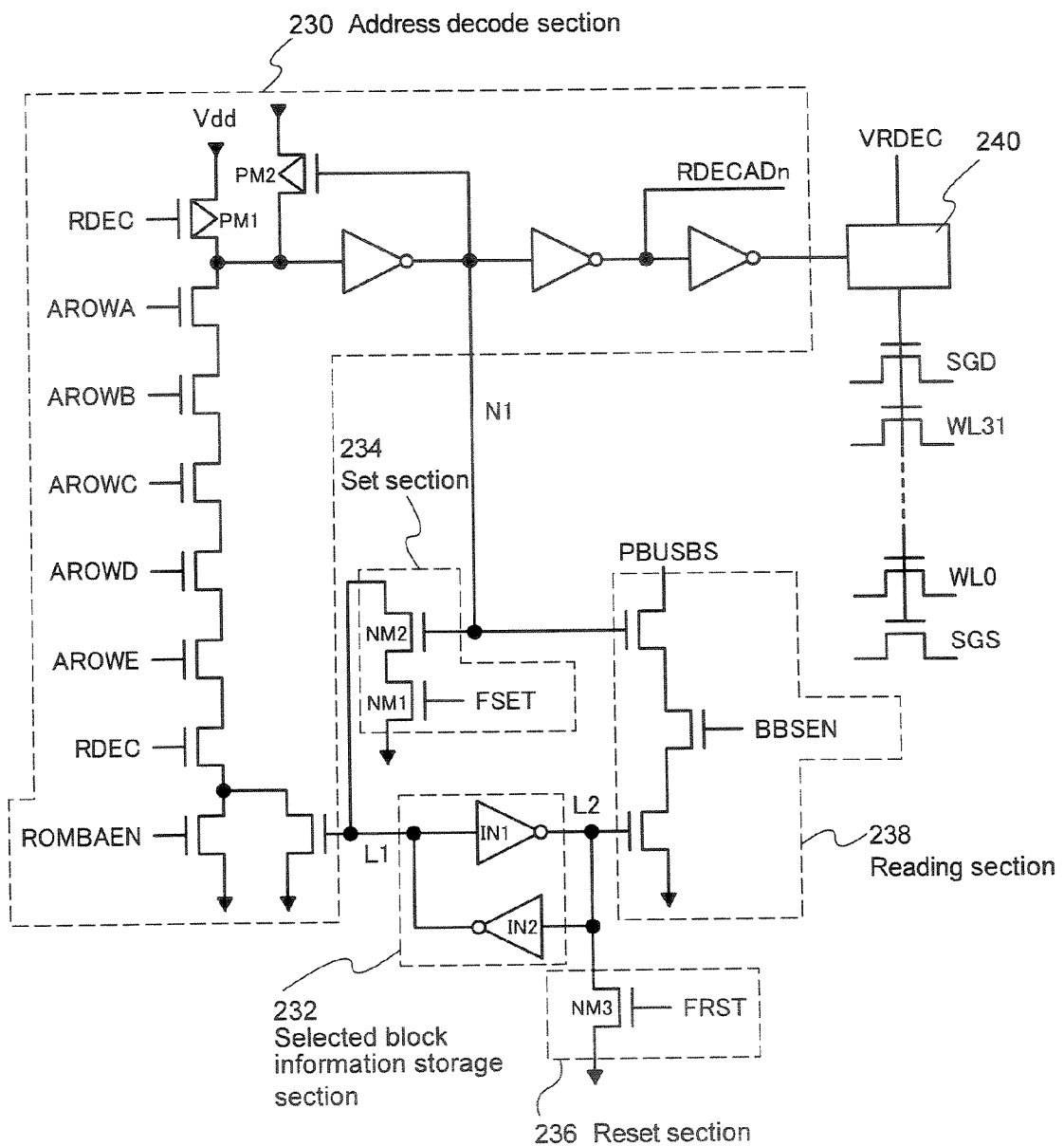
FIG. 12 illustrates the structure of the block address decode circuit provided in the row decoder shown in EXAMPLE 1.

FIG. 12 illustrates a block address decode circuit which is a part of the row decoder as described above. This block address decode circuit has an address decode section 230 which is input with a pre-charge signal (RDEC), a row address signal (AROWA to AROWE), and a signal via a node L1. This address decode section 230 includes an output stage which is connected to a level shifter 240 that converts the level of the output of the address decode section 230 to supply the output to a corresponding selected block. The node L1 is connected to a selection block data storage section 232. The selection block data storage section 232 is a latch circuit that has inverters IN1 and IN2 and which is composed of two inverters arranged so that an input end of one inverter is connected to an output end of the other inverter.

The set section 232 has a structure in which an NMOS transistor NM1 and an nMOS transistor NM2 are serially connected. In the NMOS transistor NM1, a gate is input with a set signal (FSET) and a source is grounded. In the NMOS transistor NM2, a gate is input with an output from the address decode section 230. A reset section 236 has a structure including only an nMOS transistor NM3 in which a gate is input with a reset signal (FRST) and a source is grounded.

Specifically, the selected block data storage section 232 includes a latch composed of an inverter and whether a block is a defective block or not is determined based on a signal stored in the latch. When the block address decode circuit is accessed, AROWA to AROWE are all at a level "H". In this status, any of the read-out, program, and erasure operations can be performed.

An outline of the operation of this block address decode circuit will be described below. First, a pulse "H" as a reset signal (FRST) is input to the reset section 236 to reset the latch of the selected block data storage section 232. The node L1 is at the level "H" and the L2 node is at the level "L" and all blocks in the memory cell array 104 become not defective blocks. Thereafter, an operation for setting a defective block is performed by inputting a pulse "H" as a set signal (FSET) to the set section 234. The node L1 is at the level "L" and the L2 node is at the level "H". This set operation allows the latch of the selected block data storage section 232 to store defective block data. In this case, this defective block is selected and AROWA to AROWE are all at the level "H" and RDEC is changed from the level "L" to the level "H". Even when an operation is started, the node L1 is at the level "L" and thus the defective block is not selected.

As described above, the NAND-type flash memory device has a structure in which the row decoder includes the latch in order not to access a defective block. Thus, a defective block is selected and all blocks are assumed as not defective blocks. Thereafter, the defective block is set.

Figure 13:
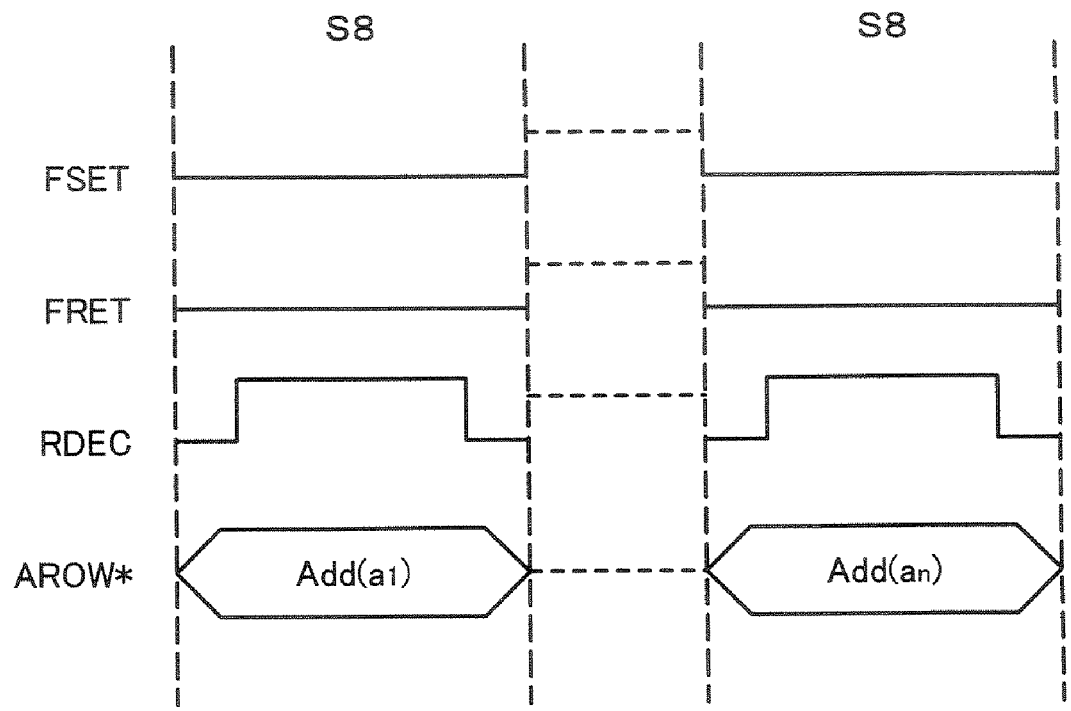
FIG. 13 is a timing chart for explaining a block erase operation.

However, this latch provided in the row decoder is mainly for storing the defective block data and thus cannot store erasure block selection data required for performing a multiple block erasure. Thus, a block erase operation has been conventionally performed by repeating an operation as shown in FIG. 13 to select every one block to erase. In FIG. 13, the time required for erasing one block is about 2 msec and the time required for erasing N blocks is N times longer than 2 msec. The long time required for a block erasure as described above prevents the memory device from having an improved data rewrite performance even when the memory device has a very high programming or read-out speed.

To solve this, according to the present invention, the selected block data storage section 232 of the row decoder is alternately programmed with erasure block data and defective block data so that a multiple block erasure can be performed efficiently.

Figure 2:
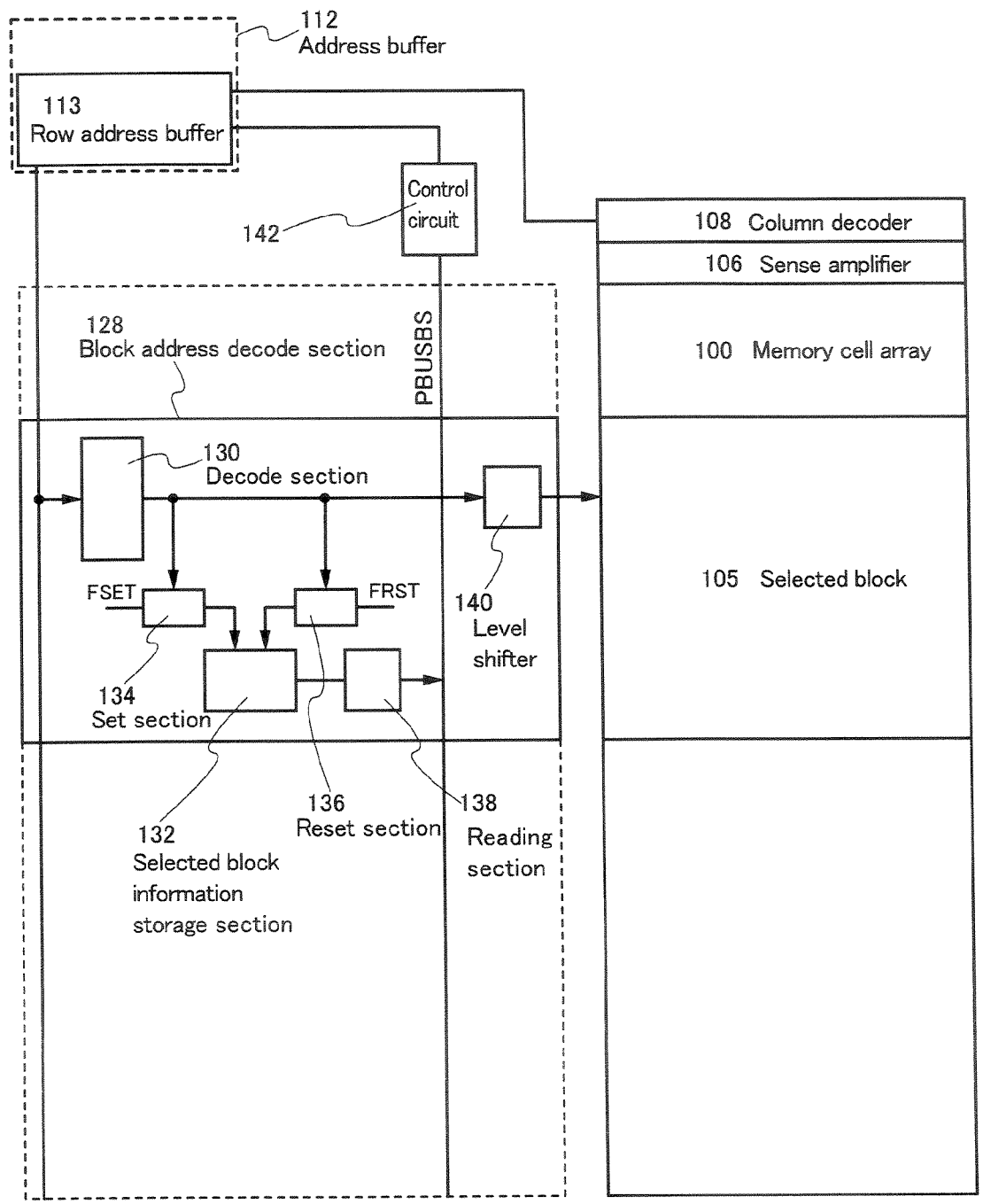
FIG. 2 illustrates the structure of a block selection section provided in a row decoder shown in FIG. 1.

FIG. 2 illustrates the structure of a block selection section provided in the row decoder 110 shown in FIG. 1. FIG. 2 shows the structure of the block address decode circuit 128 corresponding to a certain selected block 105 in the memory cell array 100. This block address decode circuit 128 includes: a decode section 130 for decoding an output of the row address buffer 113 constituting a part of the address buffer 112; and a level shifter 140 for converting the level of the output of this decode section 130 to supply the output to the corresponding selected block. The block address decode circuit 128 also has: a selected block data storage section 132; a set section 134 and a reset section 136 to this selected block data storage section 132; and a read-out section 138 for reading the data from the selected block data storage section 132 into a wiring PBUSB. A control circuit 142 is a circuit for detecting a signal from the wiring PBUSB. An output from this control circuit 142 and an output from the column decoder 108 are input to the row address buffer 113.

The set section 134 operates with the set signal (FSET). The reset section 136 operates with the reset signal (FRST). The set section 134 and the reset section 136 have a circuit configuration in which two serially connected nMOS transistors are provided. The selected block data storage section 132 controlled by the set section 134 and the reset section 136 is composed of a latch circuit.

The block address decode circuit 128 is used to select, in a well of one memory cell array, a block to be erased by a multiple block erasure operation. The block address decode circuit 128 is used, when the NAND-type flash memory device performs read-out and program operations, to show a defective block. Specifically, one latch circuit included in the block address decode circuit 128 alternately stores two pieces of data for the block address. As described above, the means for setting and resetting data for a selected block are provided to the selected block data storage section 132. Thus, different pieces of data can be stored depending on an operation's timing.

Next, when a multiple block erasure is performed in a well of one memory cell array by this block address decode circuit 128, the set section 134 sets a flag to the selected block data storage section 132 so that all blocks are apparently assumed as defective blocks. As a result, all blocks cannot be selected. Then, with regards to only a block to erase, the flag of the selected block data storage section 132 is put down by the reset section 136 so that the block can be selected. This selection can be performed to a plurality of blocks. Then, all address decode signals are selected to perform a multiple block erase operation. Specifically, a logical product of an address decode signal and a block selection signal is calculated to select a block and only the selected block is subjected to an erasure operation.

Next, when read-out and program operations are started, the reset section 136 resets the selected block data storage section 132 to set data so that all blocks are assumed as not defective blocks. Then, based on the defective block data read out from the ROM fuse block 102 of the memory cell array 100, the set section 134 sets the defective block data to the selected block data storage section 132.

As described above, according to the NAND-type flash memory device of this embodiment, the selected block data storage section of the row decoder can be alternately programmed with erasure block data and defective block data, thereby performing a multiple block erasure. Since the multiple block erasure can be effectively performed, an empty block can be effectively used even when a processing such as a data overwrite operation is repeated frequently. In this case, a need for additionally providing a storage means such as a latch circuit is eliminated, thus providing an advantage in that the circuit configuration is prevented from being complicated.

Hereinafter, examples of the present invention will be described with reference to the drawings. It is noted that the present invention can be carried out in many different modes and should not be interpreted as being limited to the description of examples shown below.

EXAMPLE 1

Figure 3:
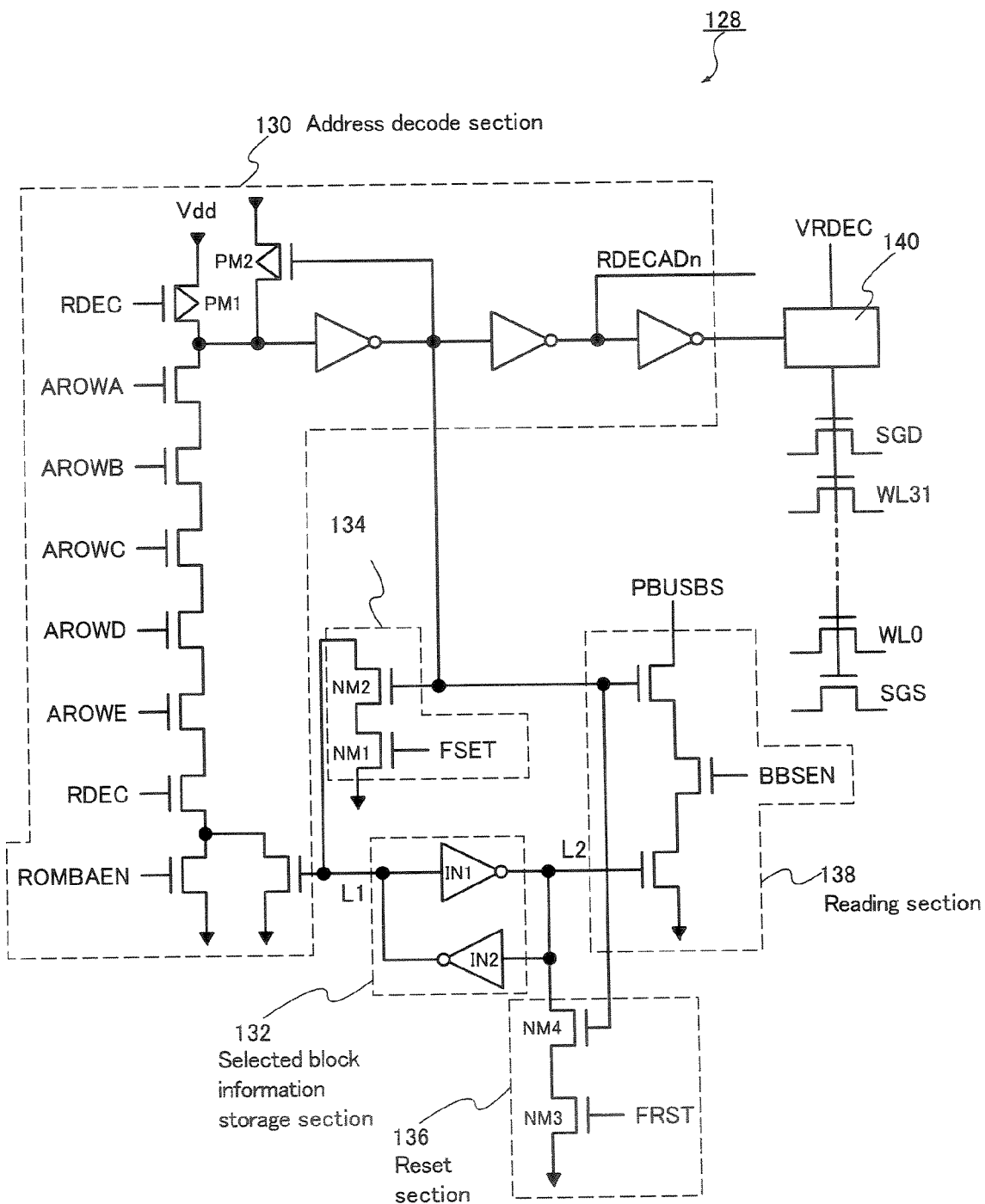
FIG. 3 shows the structure of a block address decode circuit shown in FIG. 2.

The following section will describe EXAMPLE 1 with regards to the structure of the block address decode circuit 128 shown in FIG. 2 with reference to FIG. 3. The block address decode circuit 128 shown in FIG. 3 includes the address decode section 130 which is input with a signal via the node L1 and signals such as a pre-charge signal (RDEC) or row address signals (AROWA to AROWE). This address decode section 130 has an output stage connected to the level shifter 140 that converts the level of the output to supply the output to the corresponding selected block. The node L1 is connected to the selected block data storage section 132. The selected block data storage section 132 is the so-called latch circuit which is composed of two inverters IN1 and IN2 arranged so that an input end of one inverter is connected to an output end of the other inverter.

The node L1 of the selected block data storage section 132 is connected with the set section 134 which is controlled by being input with the set signal (FSET). The node L2 of this selected block data storage section 132 is connected with the reset section 136 which is controlled by being input with the reset signal (FRST).

The set section 134 has a structure in which a gate is input with the set signal (FSET) and in which the nMOS transistor NM1 having a grounded source and an nMOS transistor NM2 having a gate input with an output from the decode section 130 are provided so as to be serially connected. The reset section 136 has a similar structure in which a gate is input with the reset signal (FRST) and in which the NMOS transistor NM3 having a grounded source and the NMOS transistor NM4 having a gate input with an output from the decode section 130 are provided so as to be serially connected. The output of the decode section 130 and the node L2 of the selected block data storage section 132 are connected to the read-out section 138.

Figure 4:
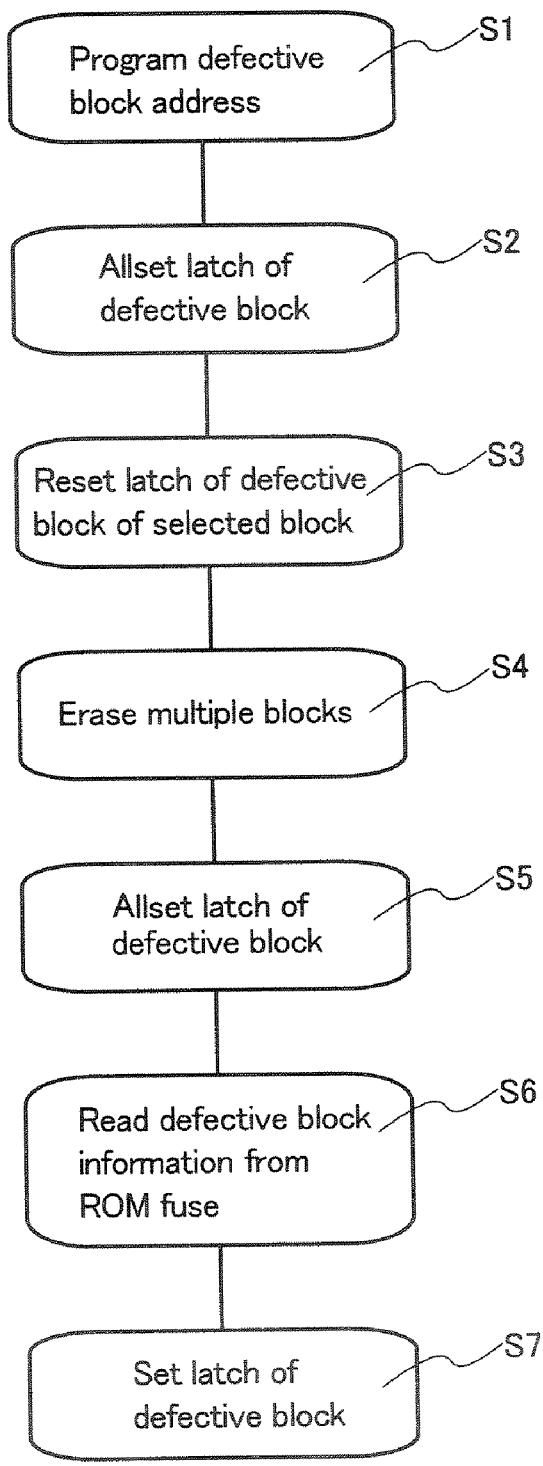
FIG. 4 is a flowchart illustrating an operation of a block address decode circuit shown in EXAMPLE 1.
Figure 5:
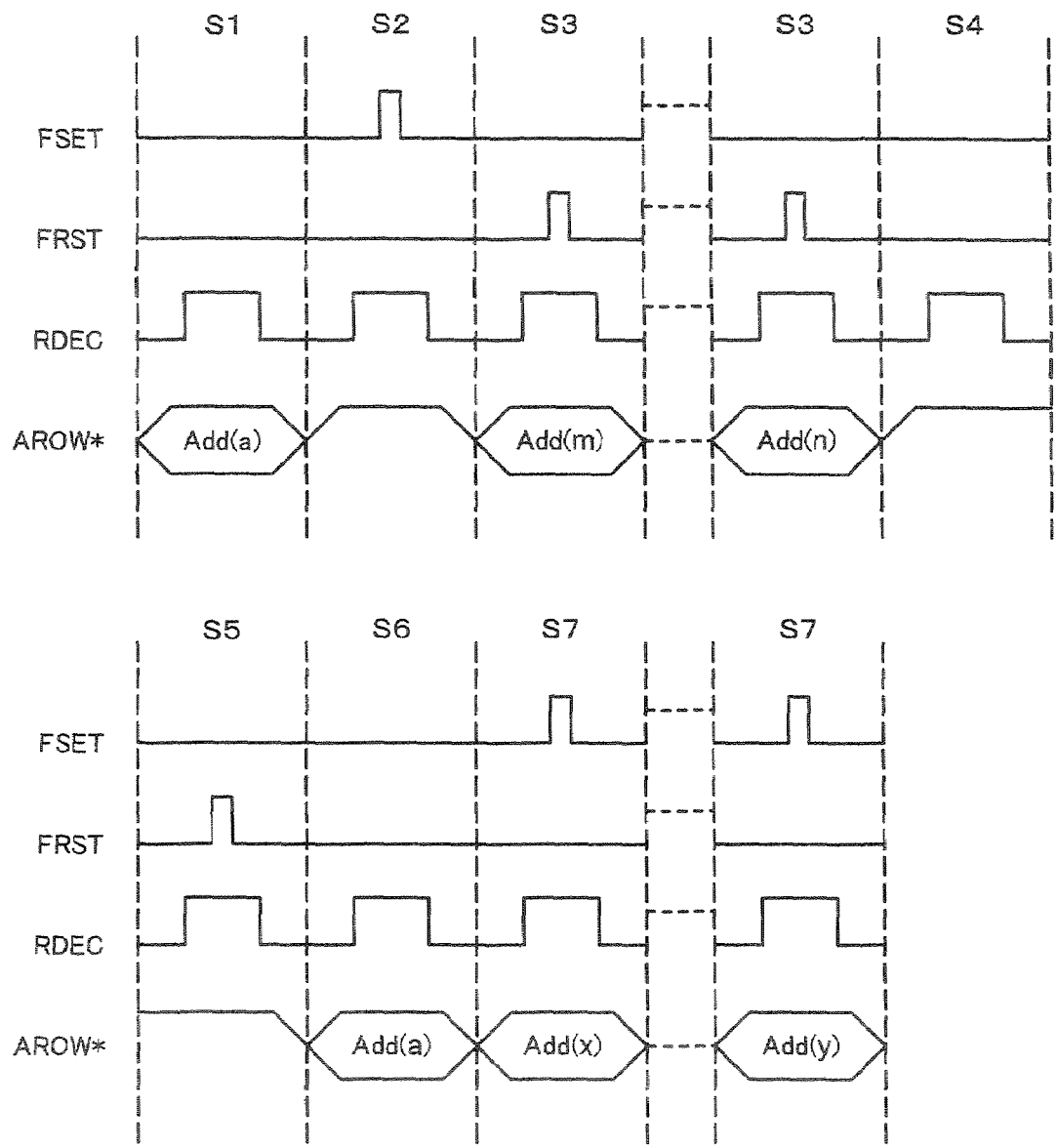
FIG. 5 is a timing chart illustrating an operation of the block address decode circuit shown in EXAMPLE 1.

Next, the operation of the block address decode circuit 128 of FIG. 3 will be described with reference to the flowchart of FIG. 4 and the timing chart of FIG. 5. The following section will describe an operation in the block address decode circuit 128 shown in FIG. 3 starting with a multiple block erasure for simultaneously erasing a plurality of blocks in a well of one memory cell array to a step for setting the defective block data. It is noted that this operation is based on the NAND-type flash memory device shown in FIG. 1.

First, an operation for programming data for an address of a defective block to a memory cell array is performed if required (S1). Specifically, the memory area (ROM fuse block 102) for storing the address data of the defective block is programmed with the defective block address. This operation requires about 0.5 msec.

Next, the pulse "H" as the set signal (FSET) is input to the set section 134 to set all latches of the selected block storage section 132 (S2). Specifically, all blocks are previously not-selected in the multiple block erasure. This operation requires about 2 μsec.

Then, with regards to blocks to erase, the pulse "H" as the reset signal (FRST) is input to the reset section 136 to reset the latch of the selected block data storage section 132 (S3). This is an operation for selecting blocks to be subjected to the multiple block erasure and is repeatedly performed "N" times to "N" blocks to be erased. This operation requires about 1 μsec for resetting one block and requires a time "N" times longer than 1 μsec in order to reset "N" blocks.

When the to-be-erased blocks are specified, then a multiple block erasure is performed (S4). The multiple block erasure requires about 3 msec. The multiple block erasure may require, when erasing an increased number of blocks, a little more time.

Thereafter, the pulse "H" as the reset signal (FRST) is input to the reset section 136 to reset the non-selected data (data assumed as the one for a defective block) stored in the selected block data storage section 132 (S5). This operation requires about 1 μsec.

Next, an operation for reading the defective block address data from the memory area (ROM fuse block 102) is performed (S6). This operation requires about 50 μsec.

Then, in order to allow the selected block data storage section 132 to store the defective block address data, the pulse "H" as the set signal (FSET) is input to the set section 134 to set the latch of the selected block data storage section 132 (S7). As a result, the defective block is not selected in the multiple block erasure. This requires about 1 μsec for one defective block and requires, for "N" defective blocks, a time "N" times longer than 1 μsec.

The steps S1 to S7 as described above require about 3.6 msec. A NAND-type flash memory device which does not perform a multiple block erasure requires 2 msec for erasing one block. Thus, when two or more blocks are erased, EXAMPLE 1 requires much less time for the erasure than this NAND-type flash memory device.

In EXAMPLE 1, when a circuit is changed in the block address decode section 128 in the row decoder 110, one nMOS transistor only has to be added to the reset section 136. The above-described steps S1 to S7 can be programmed by an existing operation command. This provides an advantageous effect according to which the circuit operation is prevented from being complicated and substantially no influence is caused to the chip size.

According to EXAMPLE 1, by allowing the selected block data storage section 132 of a row selection circuit (row decoder) to store any one of defective block data or erasure block data, different blocks can be selected in a program operation, a read-out operation, and a block erasure operation. The row decoder 110 including the selected block data storage section (latch) 132 and the reset section 136 that can be set depending on a block address can provide a multiple block erasure operation without requiring a significant change of the row decoder and without substantially requiring increase of the circuit size. At the same time, the multiple block erasure can be performed efficiently.

EXAMPLE 2

Figure 6:
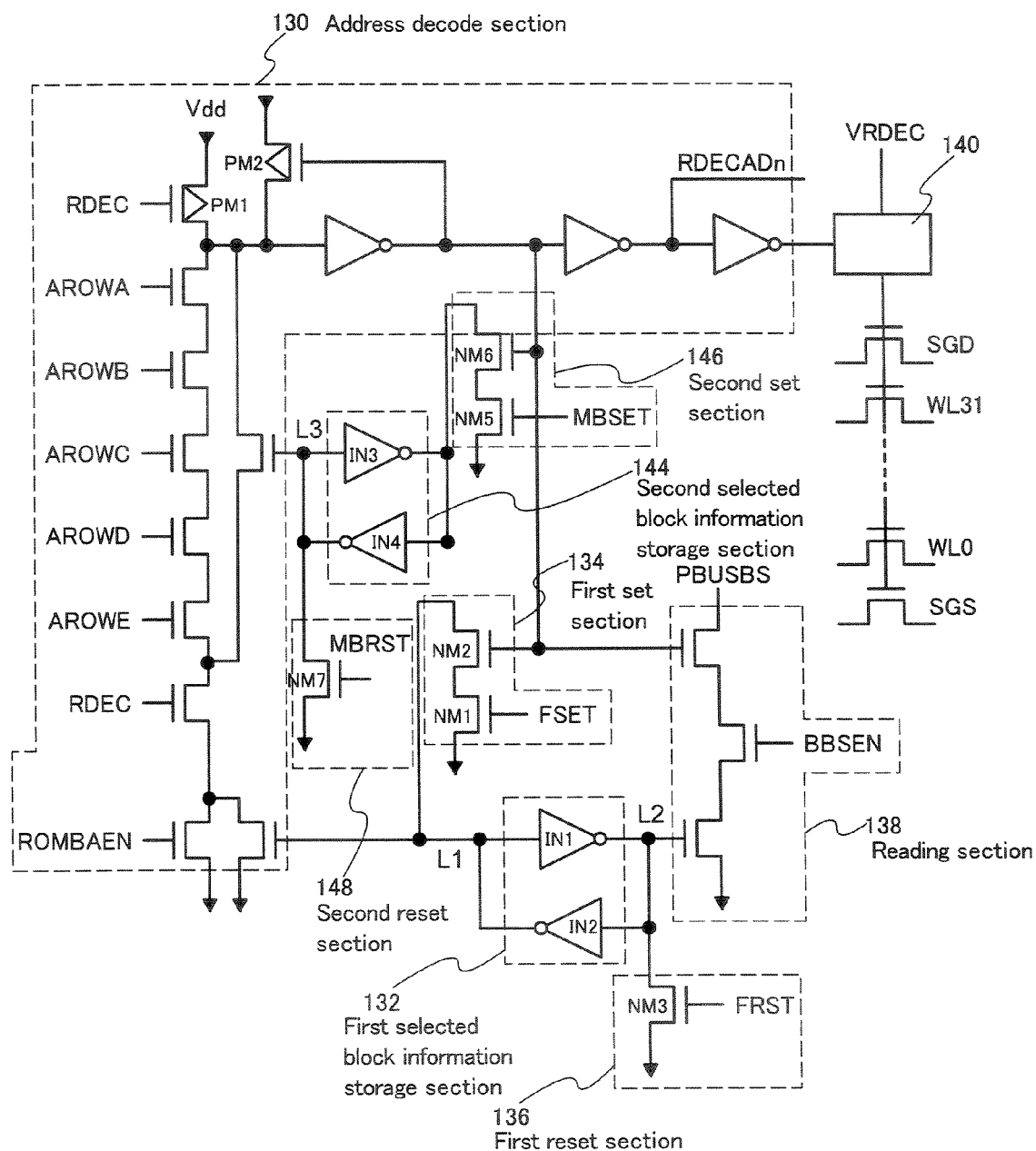
FIG. 6 illustrates the structure of a block address decode circuit provided in a row decoder shown in EXAMPLE 2.

The following section will describe EXAMPLE 2 with regards to another example of a block address decode section that can be applied to a multiple block erasure operation with reference to FIG. 6.

This block address decode circuit has an address decode section 130 input with the pre-charge signal (RDEC), the row address signal (AROWA to AROWE) or the like. The block address decode circuit also has the first selected block data storage section 132 for specifying a defective block and the second selected block data storage section 144 for specifying blocks to be erased by a multiple block erasure operation.

The first selected block data storage section 132 for specifying a defective block has the same structure as that of EXAMPLE 1. Defective block data to the first selected block data storage section 132 is set and reset by the first set section 134 and the first reset section 136. The first reset section 136 is composed of one nMOS transistor in which a gate is input with the reset signal (FRST). Defective block data can be specified, for example, based on defective block address data read-out from the ROM fuse block 102 in a memory cell array after the power source is turned ON. The above step may be the same as Step S5 to S7 described with reference to FIG. 5.

The second selected block data storage section 144 for storing data for to-be-erased blocks for a multiple block erasure operation is provided by a latch circuit composed of two inverters IN3 and IN4 arranged so that an input end of one inverter is connected to an output end of the other inverter. The second set section 146 has an NMOS transistor in which a source is grounded and a gate is input with the set signal (MBSET) and an nMOS transistor which is serially connected to this transistor and which has a gate input with an output from the decode section 130. The second reset section 148 is composed of an nMOS transistor which has a gate input with the reset signal (MBRST) and which has a grounded source.

Figure 7:
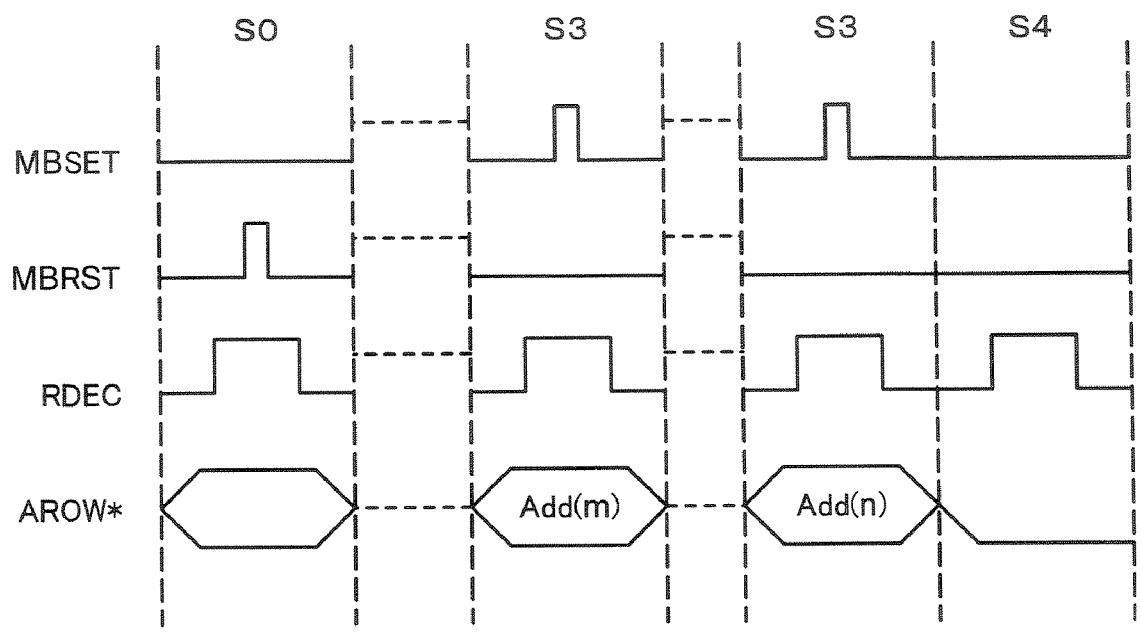
FIG. 7 is a timing chart illustrating an operation of the block address decode circuit shown in EXAMPLE 2.

Next, an operation of the block address decode circuit of FIG. 6 will be described with reference to the timing chart of FIG. 7. First, when a power source is turned ON, the second reset section 148 is input with the pulse "H" as a reset signal (MBRST) in order to reset the block selection data of the second selected block data storage section 144. As a result, all latches of the second selected block storage section 144 are reset.

Thereafter, a multiple block erasure is performed with certain timing. In this case, with regards to the to-be-erased blocks, the pulse "H" as the set signal (MBSET) is input to the second set section 146 to set the latch of the second selected block data storage section 144 (S3). This is an operation for selecting the blocks to be subjected to the multiple block erasure and is repeatedly performed "N" times to "N" blocks to be erased. This operation requires about 1 μsec for resetting one block and requires a time "N" times longer than 1 μsec in order to reset "N" blocks.

When the to-be-erased blocks are specified, then a multiple block erasure is performed (S4). The multiple block erasure requires about 3 msec. The multiple block erasure may require, when the number of blocks to erase is increased, a little more time.

After the multiple block erasure, the second reset section 148 is input with the reset signal (MBRST) with regards to the second selected block data storage section 144 to reset all latches of the second selected block data storage section 144. By repeating this operation, a multi-block erasure operation can be performed with an arbitrary timing. This operation requires about 1 μsec.

According to EXAMPLE 2, rewrite of defective block address data is not required in the multiple block erasure operation. This can proportionally reduce the time required for the erasure. Specifically, an operation such as temporarily save defective block data to subsequently read the data again can be eliminated. This provides an advantage in that the processing time can be reduced. Furthermore, defective block data stored in a latch can prevent, even when an unexpected power fluctuation is caused while the power source of the memory is ON, the defective block address data from disappearing.

According to EXAMPLE 2, by allowing the first and second selected block data storage section of a row selection circuit (row decoder) to store any one of defective block data or erasure block data, different blocks can be selected in a program operation and a reading operation. The row decoder including the first and second selected block data storage section (latch) and the first and second reset section can perform a multiple block erasure without requiring a significant change in the row decoder and an expansion of the processing time of restoring the defective block data. At the same time, the multiple block erasure operation can be performed efficiently.

I claim:

1. A nonvolatile semiconductor memory device comprising:
   a nonvolatile memory cell that can be electrically programmed, read-out and erased and which is divided into a plurality of blocks;
   a block address decode section for selecting one of the plurality of blocks;
   a selected block data storage section which is provided in the block address decode section, the selected block data storage section storing erasure block data, in an operation for simultaneously erasing the plurality of blocks in a well of the nonvolatile memory cell, or defective block data in operations other than the operation for simultaneously erasing the plurality of blocks in the well of the nonvolatile memory cell; and
   a set section and a reset section, which control stored data in the selected block data storage section according to operations so that the selected block data storage section stores either the defective block data or the erasure block data;
   wherein:
   the reset section erases the defective block data stored in the selected block data storage section depending on operation timing for simultaneously erasing the plurality of blocks; and
   the set section sets the defective block data in the selected block data storage section after the data selected block data storage section is erased, depending on a timing of an operation other than the operation for simultaneously erasing the plurality of blocks.

2. The nonvolatile semiconductor memory device according to claim 1, wherein:
   the set section initializes the erasure block data in the selected block data storage section so that the set section sets the defective block data in the selected block data storage section; and
   the reset section sets the erasure block data in the selected block data storage section after the erasure block data initialization so that the reset section erases the defective block data stored in the selected block data storage section depending on a timing of an operation for simultaneously erasing the plurality of blocks.

3. The nonvolatile semiconductor memory device according to claim 1, wherein:
   the selected block data storage section sets its block to an unselected state when the selected block data storage section stores the defective block data which indicates its block is defective.

4. The nonvolatile semiconductor memory device according to claim 3, wherein:
   the selected block data storage section is provided for a block divided in the nonvolatile memory cell.

5. The nonvolatile semiconductor memory device according to claim 1 wherein:
   the reset section has:
   a first nMOS transistor in which a gate is input with a reset signal and a source is grounded; and
   a second nMOS transistor which is serially connected with the first nMOS transistor and in which a gate is input with an address decode signal.

6. A nonvolatile semiconductor memory device, comprising:
   a memory cell array formed from a nonvolatile memory cell and that has a memory area in which data is programmed and read-out and a memory area in which defective block data is stored;
   a row decoder for selecting a row of the memory cell array;
   a selected block data storage section provided in the block address decode section of the row decoder, the selected block data storage section storing erasure block data in an operation for simultaneously erasing the plurality of blocks in a well of the nonvolatile memory cell, or defective block data in operations other than the operation for simultaneously erasing the plurality of blocks in the well of the nonvolatile memory cell;
   a reset section for erasing data stored in the selected block data storage section;
   a block erasure section for selecting a plurality of blocks to erase, based on the erasure block data to be subjected to a multiple block erasure stored in the selected block data storage section; and
   a defective block data management section for reading out the defective block data from the memory area of the memory cell array in which defective block data is stored to set the defective block data in the selected block data storage section.

7. The nonvolatile semiconductor memory device according to claim 6, wherein:
   the reset section erases the defective block data stored in the selected block data storage section depending on a timing of an operation for simultaneously erasing the plurality of blocks;
   the defective block data management section reads out the defective block data from the memory area of the memory cell array in which defective block data is stored to set the defective block data in the selected block data storage section when simultaneously erasing the plurality of blocks is completed.

8. The nonvolatile semiconductor memory device according to claim 6, wherein:
   the selected block data storage section sets its block to an unselected state when the selected block data storage section stores the defective block data which indicates its block is defective.

9. The nonvolatile semiconductor memory device according to claim 6, wherein:
   the reset section has:
   a first nMOS transistor in which a gate is input with a reset signal and a source is grounded; and a second nMOS transistor which is serially connected with the first nMOS transistor and in which a gate is input with an address decode signal.

10. A nonvolatile semiconductor memory device comprising:
   a memory cell array formed from a nonvolatile memory cell and that has a memory area in which data is programmed and read-out and a memory area in which defective block data is stored;
   a row decoder for selecting a row of the memory cell array;
   a first selected block data storage section which is provided in a block address decode section of the row decoder and that stores defective block data,
   a second selected block data storage section which is provided in the block address decode section of the row decoder and that stores selected block data to be subjected to a multiple block erasure;
   a block erasure section for selecting a plurality of blocks to erase, based on the erasure block data to be subjected to a multiple block erasure stored in the second selected block data storage section; and
   a defective block data management section for reading out the defective block data from the memory area of the memory cell array in which defective block data is stored to set the defective block data in the first selected block data storage section.

11. The nonvolatile semiconductor memory device according to claim 10, further comprising:
   a first reset section that erases the defective block data stored in the first selected block data storage section when operations other than the operation for multiple block erasure is performed; and
   a second reset section that erases the defective block data stored in the second selected block data storage section when simultaneously erasing the plurality of blocks is completed.

12. The nonvolatile semiconductor memory device according to claim 11, wherein:
   the defective block data management section reads out defective block data from the memory area of the memory cell array in which defective block data is stored to set the defective block data in the first selected block data storage section when the defective block data is erased by the first reset section.

13. The nonvolatile semiconductor memory device according to claim 11, wherein:
   the defective block data management section stores a selected block data which performs the next multiple block erasure operation, in the second selected block data storage section when the selected block data is erased by the second reset section.

14. The nonvolatile semiconductor memory device according to claim 10 wherein:
   the first selected block data storage section sets its block to an unselected state when the selected block data storage section stores the defective block data which indicates its block is defective.

15. The nonvolatile semiconductor memory device according to claim 11 further comprising:
   a first set section that sets the defective block data in the first selected block data storage section when operations other than the operation for multiple block erasure is performed;
   a second set section that erases the defective block data in the second selected block data storage section when the operation for multiple block erasure is performed; and
   the second set section has:
   a first nMOS transistor in which a gate is input with a set signal and a source is grounded; and
   a second nMOS transistor which is serially connected with the first nMOS transistor and in which a gate is input with an address decode signal;
   the first set section has:
   a third nMOS transistor in which a gate is input with a set signal and a source is grounded; and
   a fourth nMOS transistor which is serially connected with the third nMOS transistor and in which a gate is input with an address decode signal.

* * * * *